United States Patent
Bringivijayaraghavan et al.

(10) Patent No.: US 8,004,313 B2
(45) Date of Patent: *Aug. 23, 2011

(54) METHODS, DEVICES, AND SYSTEMS FOR A HIGH VOLTAGE TOLERANT BUFFER

(75) Inventors: Venkatraghavan Bringivijayaraghavan, Plano, TX (US); Jason Brown, Allen, TX (US)

(73) Assignee: Micron Technology, Inc., Bosie, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/577,506

(22) Filed: Oct. 12, 2009

(65) Prior Publication Data

US 2010/0026344 A1 Feb. 4, 2010

Related U.S. Application Data

(63) Continuation of application No. 11/877,868, filed on Oct. 24, 2007, now Pat. No. 7,605,611.

(51) Int. Cl.
*H03K 19/0175* (2006.01)
(52) U.S. Cl. ............................. 326/87; 326/83
(58) Field of Classification Search .............. 326/80–83, 326/86–87; 327/108, 109, 333
See application file for complete search history.

(56) References Cited

U.S. PATENT DOCUMENTS

| | | | |
|---|---|---|---|
| 5,157,573 A | 10/1992 | Lee et al. | |
| 5,173,755 A | 12/1992 | Co et al. | |
| 5,398,318 A | 3/1995 | Hiraishi et al. | |
| 5,418,476 A | 5/1995 | Strauss | |
| 5,602,494 A | 2/1997 | Sundstrom | |
| 6,051,995 A | 4/2000 | Pollachek | |
| 6,093,659 A | 7/2000 | Grider et al. | |
| 6,429,716 B1 * | 8/2002 | Drapkin et al. | 327/333 |
| 6,628,149 B2 | 9/2003 | Ajit | |
| 6,803,789 B1 | 10/2004 | Yu et al. | |
| 6,903,581 B2 | 6/2005 | Clark et al. | |
| 6,965,263 B2 | 11/2005 | Bringivijayaraghavan | |
| 7,183,817 B2 | 2/2007 | Sanchez et al. | |
| 7,193,441 B2 | 3/2007 | Chen et al. | |
| 7,282,953 B2 * | 10/2007 | Wu et al. | 326/68 |
| 7,362,136 B2 | 4/2008 | Chen | |
| 2006/0214688 A1 | 9/2006 | Pan et al. | |
| 2007/0018726 A1 | 1/2007 | Okamura | |
| 2007/0063730 A1 | 3/2007 | Gallo et al. | |
| 2007/0195563 A1 * | 8/2007 | Shiraishi et al. | 363/25 |

\* cited by examiner

*Primary Examiner* — James Cho
(74) *Attorney, Agent, or Firm* — TraskBritt

(57) ABSTRACT

Methods, devices, and systems are disclosed, including those for a buffer having pre-driver circuitry configured to provide voltages to thin-gate dielectric transistors. One such buffer may comprise a plurality of pre-drivers wherein each pre-driver of the plurality of pre-drivers is operably coupled to a transistor of a plurality of transistors. The buffer may further comprise one or more clamping devices, wherein at least one transistor of the plurality of transistors has a gate coupled to at least one clamping device of the one or more clamping devices.

20 Claims, 6 Drawing Sheets

METHODS, DEVICES, AND SYSTEMS FOR A HIGH VOLTAGE TOLERANT BUFFER

CROSS-REFERENCE TO RELATED APPLICATION

This application is a continuation of application Ser. No. 11/877,868, filed Oct. 24, 2007, now U.S. Pat. No. 7,605,611 issued Oct. 20, 2009, the disclosure of which is incorporated by reference herein in its entirety.

FIELD OF THE INVENTION

Embodiments of the present invention relate to semiconductor integrated circuits. More particularly, embodiments of the present invention relate to a buffer configured to be implemented with thin-gate dielectric transistors, to devices and systems utilizing same, and to methods of operation.

BACKGROUND

As known in the semiconductor art, demand continues to increase for sub-micron semiconductor devices with high density, high performance, and ultra large-scale integration. These semiconductor devices require increased speeds, high reliability, and increased manufacturing throughput. As the semiconductor device geometries continue to decrease, the conventional semiconductor technologies are challenged in forming gate dielectric layers.

Conventional semiconductor devices comprise a substrate having various electrically isolated regions, called active regions, in which individual circuit components are formed. The active region typically includes source and drain regions of a transistor formed in the semiconductor substrate, spaced apart by a channel region. A gate electrode for switching the transistor is formed on the channel with a gate dielectric layer isolating the gate electrode and the substrate. The quality and thickness of the gate dielectric are crucial for the performance and reliability in the finished integrated circuit (IC) device.

Furthermore, the speed of circuit components, such as MOS transistors, is affected by the time required to charge and discharge parasitic load capacitances in a circuit. Since a lower operating voltage leads to a shorter time of charging and discharging the load capacitances, faster circuitry is therefore typically obtained. In order to reduce the operating voltage, however, the threshold voltage of the transistor must also be lowered. One way to lower the threshold voltage is to reduce the thickness of the gate dielectric layer, which contributes proportionately to the body effect and hence, the threshold voltage.

As mentioned above, the reliability of a transistor is also affected by the thickness of its gate dielectric. For example, if an excessive potential is applied to the gate electrode, the gate dielectric may break down and cause a short circuit, typically between the gate electrode and the source. The potential at which the gate dielectric breakdown occurs is termed the "breakdown voltage," which is related to the thickness of the gate dielectric. Since the gate dielectric layer must be thick enough to prevent a breakdown, a higher operating voltage necessitates a thicker gate dielectric to support a higher breakdown voltage.

As known in the art, semiconductor devices may have circuit components operating at different voltages within the same IC. For example, a microprocessor may include speed-critical components that are operated at lower voltages (e.g., 1.0 V to 1.2 V), and may also contain less speed-critical components that operate at higher operating voltages (e.g., 1.5 V to 2.0 V). Transistors utilizing a low operating voltage (e.g., 1.2V) may have a thinner gate dielectric layer (typically 31 Angstroms), while transistors with higher operating voltages (e.g., 1.5 V) may have a thicker gate dielectric layer (typically 61 Angstroms). This increase in the gate dielectric thickness makes the gate dielectric less susceptible to a breakdown.

Input/output (I/O) buffer circuits typically need to translate an input operating voltage to a higher or lower operating voltage. Conventional buffer architectures may include higher voltage, thick-gate dielectric transistors to implement buffers for safe operation, yet such buffers suffer from low performance, particularly at lower voltage levels of the chip. On the other hand, conventional buffer architectures may include thin-gate dielectric transistors, which are smaller and significantly faster but which are unable to withstand the higher voltage levels and, as a result, may not be reliable.

There is a need for methods, devices, and systems to enhance the operation of buffers. Specifically, there is a need for a buffer configured to tolerate higher external operating voltages while meeting performance specifications.

DETAILED DESCRIPTION

Figure 1:
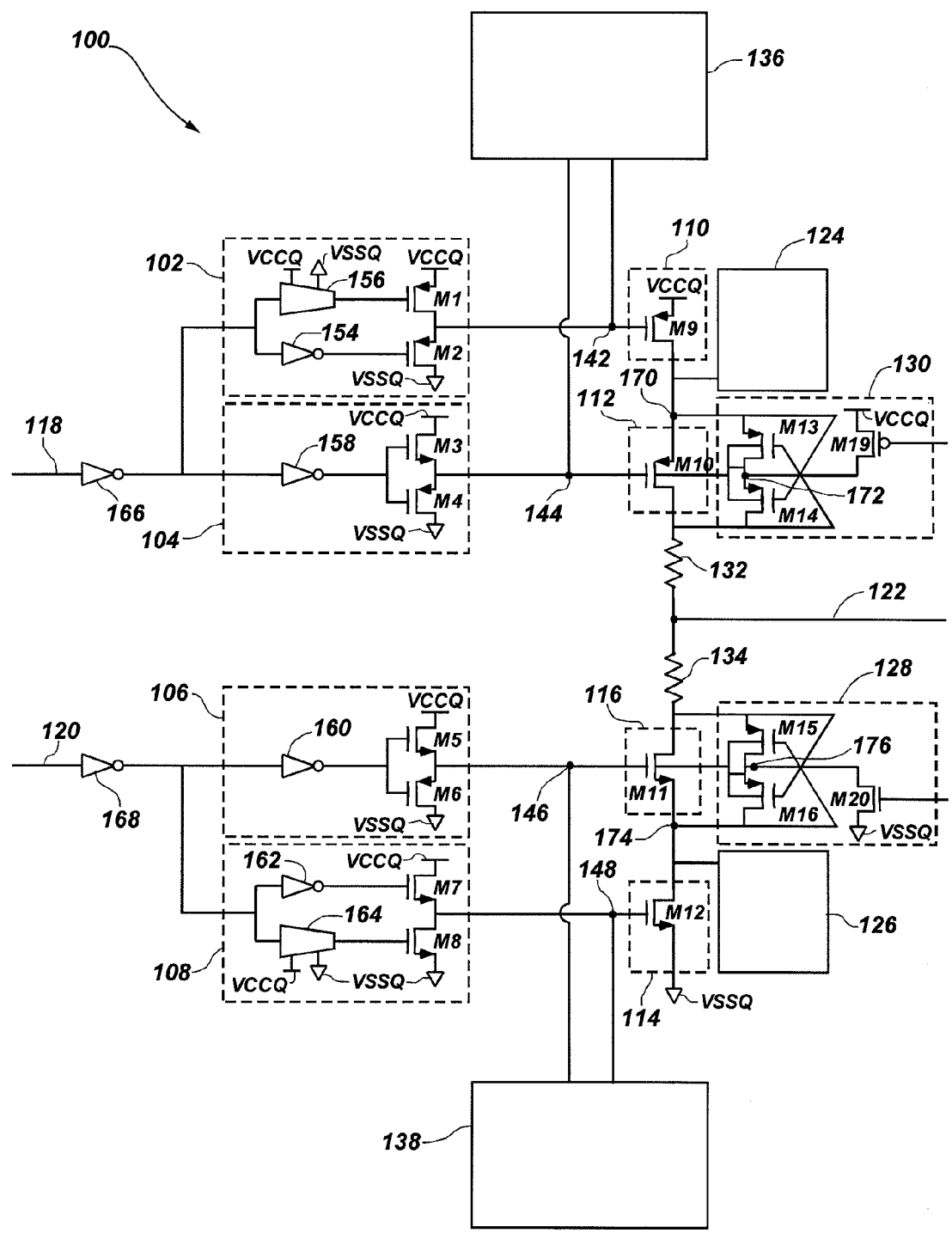
FIG. 1 is a circuit diagram of a buffer, in accordance with an embodiment of the present invention.

The present invention, in various embodiments, comprises methods, apparatuses, and systems for a buffer configured to be implemented with thin-gate dielectric transistors. In the following detailed description, reference is made to the accompanying drawings which form a part hereof and, in which is shown by way of illustration, specific embodiments in which the invention may be practiced. These embodiments are described in sufficient detail to enable those of ordinary skill in the art to practice the invention, and it is to be understood that other embodiments may be utilized, and that structural, logical, and electrical changes may be made within the scope of the present invention.

In this description, circuits and functions may be shown in block diagram form in order not to obscure the present invention in unnecessary detail. Furthermore, specific circuit implementations shown and described are only examples and should not be construed as the only way to implement the present invention unless specified otherwise herein. Block definitions and partitioning of logic between various blocks represent a specific implementation. It will be readily apparent to one of ordinary skill in the art that the various embodiments of the present invention may be practiced by numerous other partitioning solutions. For the most part, details concerning timing considerations, and the like, have been omitted where such details are not necessary to obtain a complete understanding of the present invention in its various embodiments and are within the abilities of persons of ordinary skill in the relevant art.

The terms "assert" and "negate" are respectively used when referring to the rendering of a signal, status bit, or similar apparatus into its logically true or logically false state. If the logically true state is a logic level one, the logically false state will be a logic level zero. Conversely, if the logically true state is a logic level zero, the logically false state will be a logic level one. Furthermore, in FIGS. 1 and 3A-3D described below, positive-channel metal-oxide semiconductor (PMOS) and negative-channel metal-oxide semiconductor (NMOS) transistors are represented schematically by symbols with source electrode arrows pointing respectively toward and away from the transistor gate.

Embodiments of the present invention include a buffer having a plurality of thin-gate dielectric transistors, such as thin-gate oxide transistors, and implemented in a manner to provide a sufficiently low voltage to the gate of all thin-gate dielectric transistors so as to sustain the gate dielectric integrity of the transistors. Gate dielectric integrity may be improved by limiting the rail potential at the gate of all thin-gate dielectric transistors and, thus, limiting the gate-to-source, gate-to-drain, and source-to-drain voltage drops across all thin-gate dielectric transistors to below a specific voltage, such as, for example, 1.35 volts. Furthermore, by using thin-gate dielectric transistors, pin capacitance, slew rate, and impedance requirements may be met. A contemplated configuration of a buffer will first be described with reference to FIG. 1. Thereafter, a contemplated operation of the buffer including explanation of various node and output voltages will be described in reference to FIGS. 1, 2, and 3A-3D.

A circuit diagram of a buffer 100 according to an embodiment of the present invention is illustrated in FIG. 1. For example only, and not by way of limitation, buffer 100 may comprise an output buffer. Buffer 100 includes a primary pull-up pre-driver 102, a secondary pull-up pre-driver 104, a primary pull-down pre-driver 108, and a secondary pull-down pre-driver 106. Buffer 100 may also include a pull-up input signal 118 operably coupled through inverter 166 to primary pull-up pre-driver 102 and secondary pull-up pre-driver 104. Additionally, buffer 100 may also include a pull-down input signal 120 operably coupled through inverter 168 to primary pull-down pre-driver 108 and secondary pull-down pre-driver 106.

Primary pull-up pre-driver 102 may include an inverter 154 and a buffer 156, each operably coupled to and configured to receive an input from an inverter 166. Furthermore, an output of inverter 154 may be operably coupled to a gate of transistor M2 and an output of buffer 156 may be operably coupled to a gate of transistor M1. For example only, transistors M1 and M2 may each comprise a PMOS transistor. As illustrated in FIG. 1, a source of transistor M1 may be operably coupled to an external supply voltage VCCQ and a drain of transistor M2 may be operably coupled to a ground voltage VSSQ. Furthermore, a drain of transistor M1 may be operably coupled to a source of transistor M2.

Secondary pull-up pre-driver 104 may include an inverter 158 operably coupled to and configured to receive an input from inverter 166. Furthermore, inverter 158 may be operably coupled to a gate of transistor M3 and to a gate of transistor M4. For example only, transistor M3 may comprise an NMOS transistor and transistor M4 may comprise a PMOS transistor. A drain of transistor M3 may be operably coupled to external supply voltage VCCQ and a drain of transistor M4 may be operably coupled to ground voltage VSSQ. In addition, a source of transistor M3 may be operably coupled to a source of transistor M4.

Primary pull-down pre-driver 108 may include an inverter 162 and a buffer 164, each operably coupled to and configured to receive an input from an inverter 168. Furthermore, an output of inverter 162 may be operably coupled to a gate of transistor M7 and an output of buffer 164 may be operably coupled to a gate of transistor M8. For example only, transistors M7 and M8 may each comprise an NMOS transistor. As illustrated in FIG. 1, a drain of transistor M7 may be operably coupled to external supply voltage VCCQ and a source of transistor M8 may be operably coupled to ground voltage VSSQ. Furthermore, a drain of transistor M8 may be operably coupled to a source of transistor M7.

Secondary pull-down pre-driver 106 may include an inverter 160 operably coupled to and configured to receive an input from inverter 168. Furthermore, inverter 160 may be operably coupled to a gate of transistor M5 and to a gate of transistor M6. For example only, transistor M6 may comprise a PMOS transistor and transistor M5 may comprise an NMOS transistor. A drain of transistor M5 may be operably coupled to external supply voltage VCCQ and a drain of transistor M6 may be operably coupled to ground voltage VSSQ. In addition, a source of transistor M5 may be operably coupled to a source of transistor M6.

Buffer 100 may also include a primary pull-up device 110, a secondary pull-up device 112, a primary pull-down device 114, and a secondary pull-down device 116. For example only, primary pull-up device 110 and secondary pull-up device 112 may comprise PMOS transistors M9 and M10, respectively. Furthermore, for example only, primary pull-down device 114 and secondary pull-down device 116 may comprise NMOS transistors M12 and M11, respectively. A gate of transistor M9 may be operably coupled between the drain of transistor M1 and the source of transistor M2. As a result, primary pull-up pre-driver 102 may be configured to drive primary pull-up device 110. Furthermore, a gate of transistor M10 may be operably coupled between the source of transistor M4 and the source of transistor M3. Therefore, secondary pull-up pre-driver 104 may be configured to drive secondary pull-up device 112. A gate of transistor M12 may be operably coupled between the drain of transistor M8 and the source of transistor M7. As a result, primary pull-down pre-driver 108 may be configured to drive primary pull-down device 114. Furthermore, a gate of transistor M11 may be operably coupled between the source of transistor M6 and the source of transistor M5. Therefore, secondary pull-down pre-driver 106 may be configured to drive secondary pull-down device 116.

As illustrated in FIG. 1, a bulk node of transistor M10 may be operably coupled to a pull-up bulk device 130 and a bulk node of transistor M11 may be operably coupled to a pull-down bulk device 128. Pull-up bulk device 130 may include transistor M13, transistor M14, and transistor M19. As known in the art, pull-up bulk device 130 may be configured to hold the bulk node of transistor M10 to the higher of the source voltage of transistor M10 and the drain voltage of transistor M10. As a result, pull-up bulk device 130 may be configured to lower the threshold voltage and increase the drive of transistor M10. Pull-down bulk device 128 may include transistor M15, transistor M16, and transistor M20. Pull-down bulk device 128 may be configured to hold the bulk node of transistor M11 to the lower of the source voltage of transistor M11 and the drain voltage of transistor M11. Therefore, pull-down bulk device 128 may be configured to lower the threshold voltage and increase the drive of transistor M11.

Clamping device 136 may include circuitry (e.g., a clamping diode) configured to ensure nodes 142 and 144 do not fall below a specific voltage level (e.g. nodes 142 and 144 should not fall below a threshold voltage). Furthermore, clamping device 136 may include circuitry for enabling and disabling clamping device 136. Similarly, clamping device 138 may include circuitry (e.g., a clamping diode) configured to ensure nodes 146 and 148 do not rise above a specific voltage level (e.g., nodes 146 and 148 should not rise above the supply voltage minus a threshold voltage). Additionally, clamping device 138 may include circuitry for enabling and disabling clamping device 138. Moreover, clamping devices 124 and 126 may include circuitry (e.g., clamping diodes) configured to ensure nodes 170 and 174, respectively, remain within a specific voltage range (i.e., clamping device 124 should ensure that the source to drain voltage drop across transistors M9 and M10 is less than 1.35 volts and clamping device 126 should ensure that the drain to source voltage drop across transistors M11 and M12 is less than 1.35 volts). Buffer 100 may also include resistors 132 and 134 operably coupled between the drain of transistor M10 and the drain of transistor M11. Furthermore, an output node 122 (i.e., DQ pin) is operably coupled between resistors 132 and 134.

As configured, during operation of buffer 100, a voltage at node 142 ($V_{142}$) may swing from the supply voltage VCCQ to the ground voltage VSSQ plus a threshold voltage of transistor M2 (i.e., VCCQ>=$V_{142}$>=VSSQ+Vtp). Furthermore, during operation, a voltage at node 144 ($V_{144}$) may swing from the supply voltage VCCQ minus a threshold voltage of transistor M3 to the ground voltage VSSQ plus a threshold voltage of transistor M4 (i.e., VCCQ−Vtn>=$V_{144}$>=VSSQ+Vtp). Moreover, a voltage at node 148 ($V_{148}$) may swing from the supply voltage VCCQ minus a threshold voltage of transistor M7 to the ground voltage VSSQ (i.e., VCCQ−Vtn>=$V_{148}$>=VSSQ). Additionally, a voltage at node 146 ($V_{146}$) may swing from the supply voltage VCCQ minus a threshold voltage of M5 to the ground voltage VSSQ plus a threshold voltage of transistor M6 (i.e., VCCQ−Vtn >=$V_{146}$>=VSSQ+Vtp). By limiting the range of voltages applied on nodes 142, 144, 146, and 148, the voltage drops across transistors M9-M12 may also be limited, as described below.

Throughout this description it is assumed that the supply voltage VCCQ is equal to approximately 1.6 volts and a threshold voltage of a transistor is approximately 0.3 volt. Those of ordinary skill in the art will recognize that the numerical values of the operating supply voltage, threshold voltages, and the node voltages are representative embodiments and are not limiting of the scope of the present invention in any of its embodiments.

Figure 2:
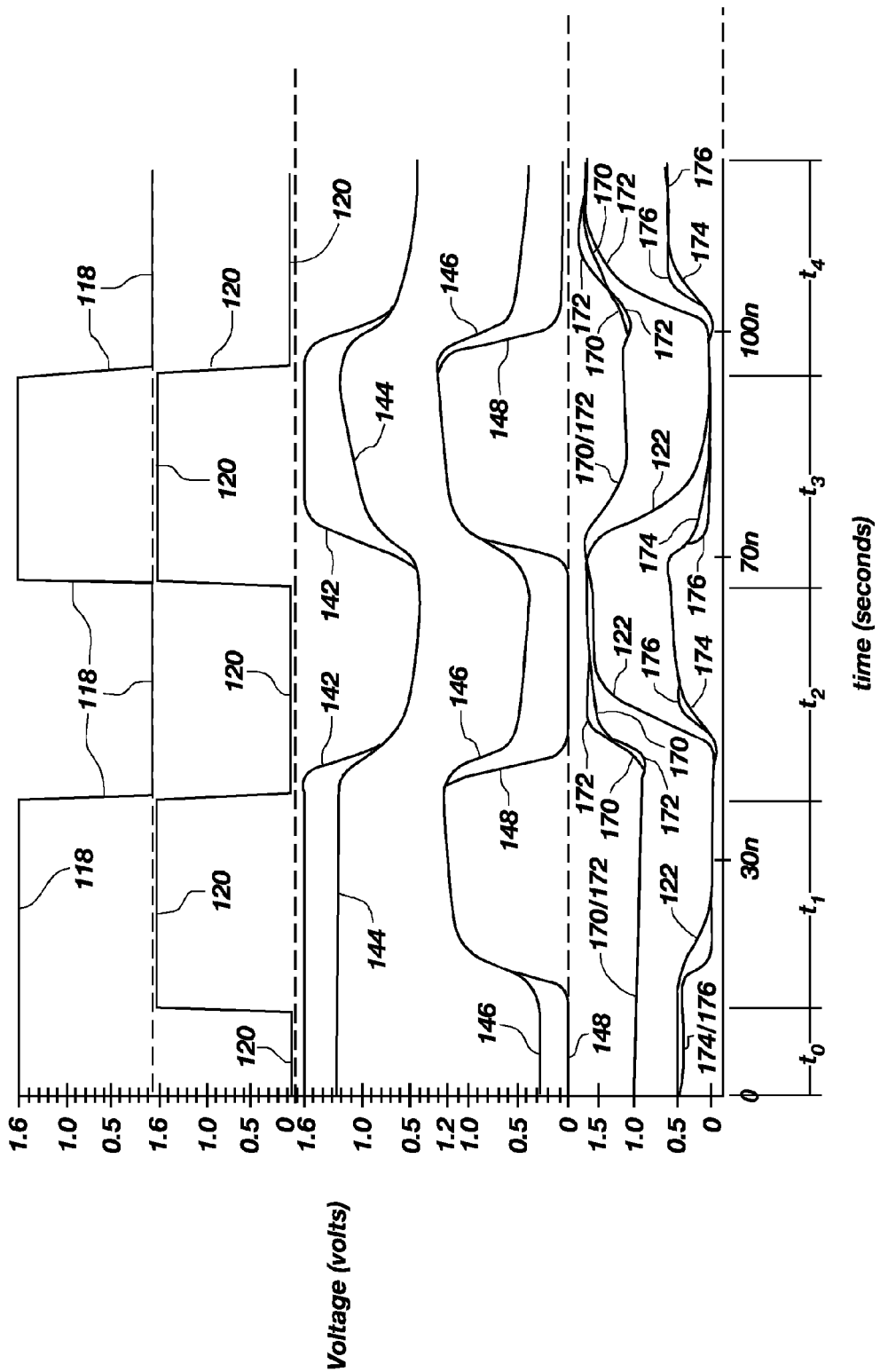
FIG. 2 illustrates a representative timing diagram of an operation of the buffer illustrated in FIG. 1.
Figure 3A:
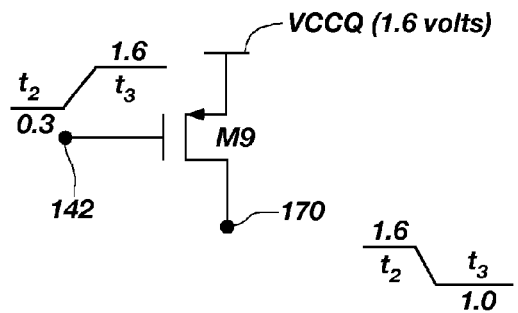
FIGS. 3A-3D illustrate the gate, drain, and source voltage levels of each thin-gate dielectric transistor within the buffer illustrated in FIG. 1 during various time periods.
Figure 3B:
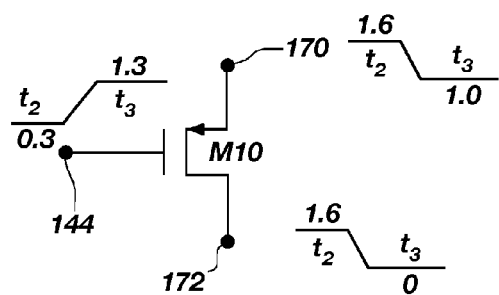
Figure 3C:
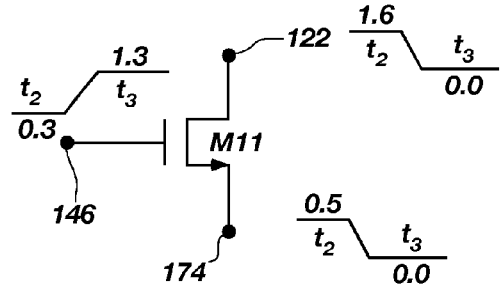
Figure 3D:
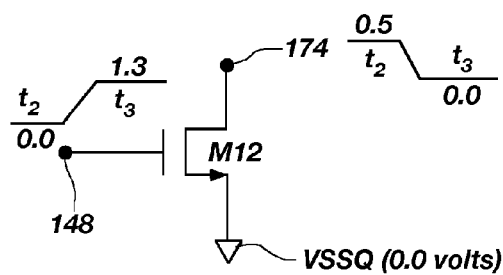
Figure 4:
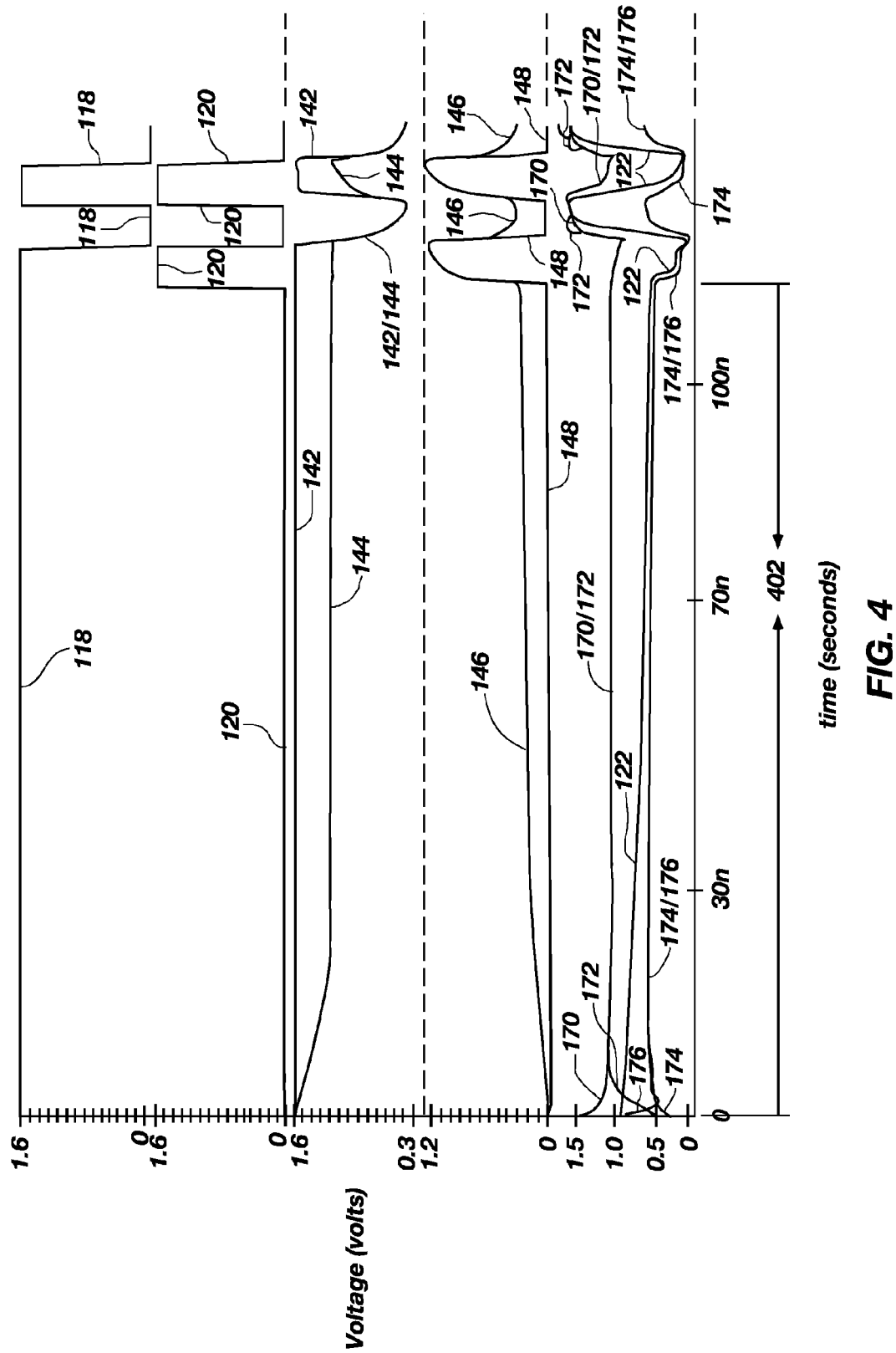
FIG. 4 illustrates another representative timing diagram of an operation of the buffer illustrated in FIG. 1 during a startup time period.
Figure 5:
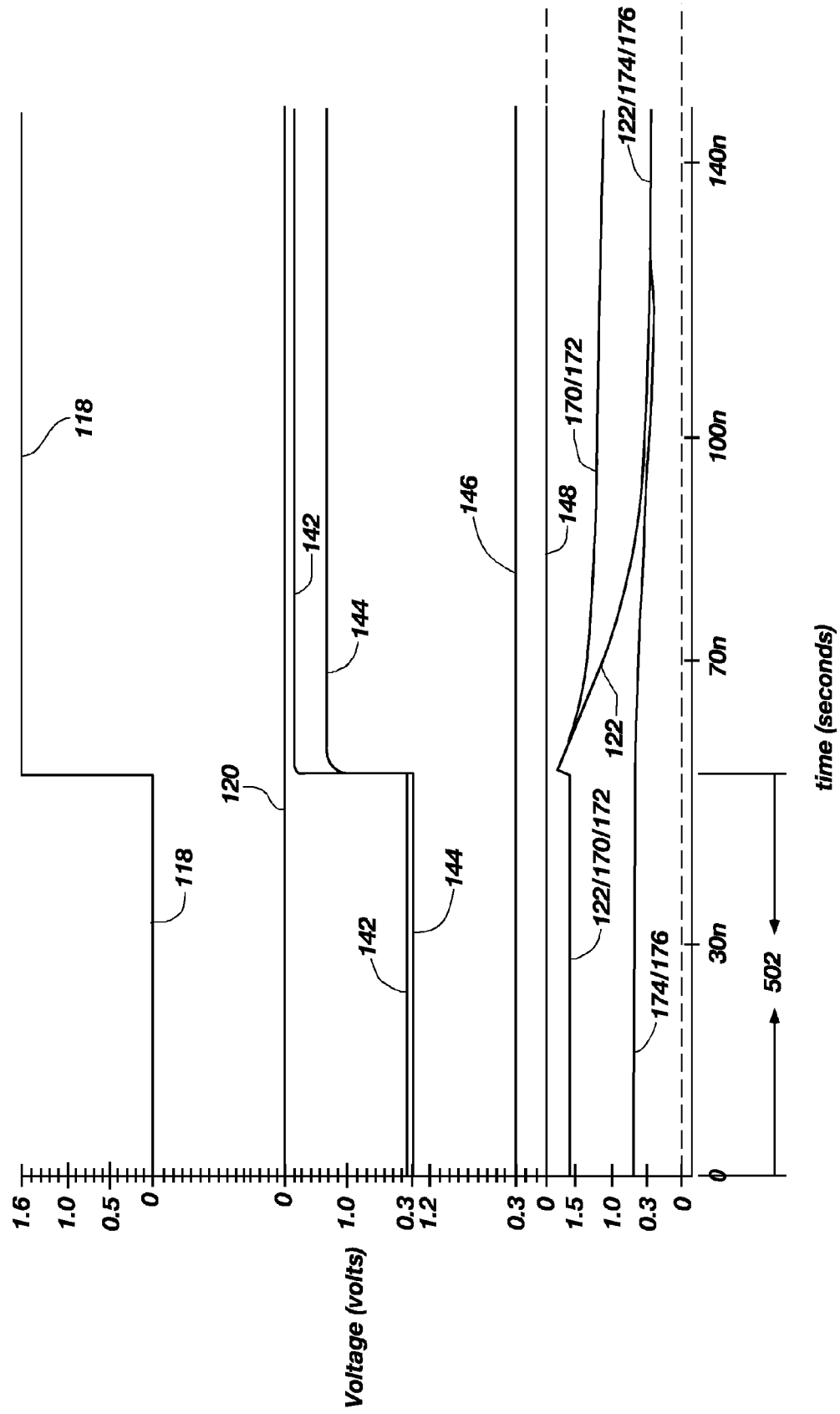
FIG. 5 illustrates another representative timing diagram of an operation of the buffer illustrated in FIG. 1 during a tri-state condition.

FIGS. 2, 4, and 5 illustrate representative timing diagrams during operation of buffer 100 according to an embodiment of the invention. Furthermore, FIGS. 3A-3D illustrate the gate, drain, and source voltage levels of each thin-gate dielectric transistor (M9-M12) during various time periods of operation. Referring to FIGS. 1 and 2, initially, at time $t_0$, input signal 118 is asserted and input signal 120 is negated. With input signal 118 asserted, transistor M2 is turned off, transistor M1 is conducting and, therefore, the voltage at node 142 is equal to voltage supply VCCQ (i.e., $V_{142}$=1.6 V). Additionally, with input signal 118 asserted, transistor M3 is conducting, transistor M4 is turned off, and the voltage at node 144 is equal to the voltage supply VCCQ minus the voltage drop across transistor M3 (i.e., $V_{144}$=1.6 V−0.3 V=1.3 V). Furthermore, with input signal 120 negated, transistor M7 is turned off, transistor M8 is conducting, and the voltage at node 148 is equal to ground voltage VSSQ. Moreover, while input signal 120 is negated, transistor M5 is turned off, transistor M6 is conducting, and the voltage at node 146 is equal to the ground voltage VSSQ plus the voltage drop across transistor M6 (i.e., $V_{146}$=0.0 volt+0.3 volt=0.3 volt). Additionally, the voltages at nodes 170 and 172 are at approximately 1.0 volt and the voltages at nodes 174 and 176 are at approximately 0.5 volt.

Subsequently, at time $t_1$, both input signal 118 and input signal 120 are asserted. With input signal 120 asserted, transistors M5 and M7 are conducting and transistors M6 and M8 are turned off. As a result, the voltage at node 146 rises to the voltage supply VCCQ minus the voltage drop across transistor M5 (i.e., $V_{146}$=1.6 volts−0.3 volt=1.3 volts) and the voltage at node 148 rises to the voltage supply VCCQ minus the voltage drop across transistor M7 (i.e., $V_{148}$=1.6 volts−0.3 volts=1.3 volt). Additionally, the voltages at nodes 170 and 172 remain substantially near 1.0 volt and the voltages at nodes 122, 174, and 176 each fall to ground voltage VSSQ.

At time $t_2$, input signal 118 and input signal 120 are each negated, transistor M1 is turned off, transistor M2 is conducting, and the voltage at node 142 falls to the ground voltage VSSQ plus the threshold voltage of transistor M2 (i.e., $V_{142}$=0.0 volt+0.3 volt=0.3 volt). Furthermore, transistor M3 is turned off, transistor M4 is conducting, and the voltage at node 144 falls to the ground voltage VSSQ plus the threshold voltage of transistor M4 (i.e., $V_{144}$=0.0 volt+0.3 volt=0.3 volt). Additionally, transistor M5 is turned off, transistor M6 is conducting, and the voltage at node 146 falls to the ground voltage VSSQ plus the threshold voltage of transistor M6 (i.e., $V_{146}$=0.0 volt+0.3 volt=0.3 volt). Moreover, transistor M7 is turned off, transistor M8 is conducting and the voltage at node 148 falls to the ground voltage VSSQ. Additionally, the voltages at nodes 122, 170 and 172 each rise to the voltage supply VCCQ and the voltages at nodes 174 and 176 each rise to approximately 0.5 volt.

At time $t_3$ input signal 118 and input signal 120 are each asserted and the voltages at nodes 122, 142, 144, 146, 148, 170, 172, 174, and 176 each return to levels substantially similar to the voltage levels exhibited during time $t_1$. Furthermore, at time $t_4$, input signal 118 and input signal 120 are each negated and the voltages at nodes 122, 142, 144, 146, 148, 170, 172, 174, and 176 each return to levels substantially similar to the voltage levels exhibited during $t_2$.

FIGS. 3A, 3B, 3C, and 3D illustrate transistors M9, M10, M11, and M12, respectively. Furthermore, FIGS. 3A-3D illustrate the gate, drain, and source voltage levels of each transistor during time $t_2$ and time $t_3$. Referring to FIGS. 2 and 3A, the voltage at node 142 (i.e., the gate of transistor M9) transitions from 0.3 volt during time $t_2$ to 1.6 volt during time $t_3$. Therefore, the maximum gate-to-source voltage difference of transistor M9 occurs during time $t_2$ and is equal to 1.3 volt (i.e., 1.6 volt−0.3 volt=1.3 volt). Furthermore, the voltage at node 170 (i.e., the drain of transistor M9) transitions from 1.6 volt during time $t_2$ to 1.0 volt during time $t_3$. As a result, the maximum gate-to-drain voltage difference of transistor M9 occurs during time $t_2$ and is equal to 1.3 volt (i.e., 1.6 volt−0.3 volt=1.3 volt). Clamping device 124 (see FIG. 1) may ensure the voltage at node 170 does not drop below 0.25 volt. Moreover, the maximum source-to-drain voltage difference of transistor M9 occurs during time $t_3$ and is equal to 0.6 volt (i.e., 1.6 volt−1.0 volt=0.6 volt).

Referring to FIGS. 2 and 3B, the voltage at node 144 (i.e., the gate of transistor M10) transitions from 0.3 volt during time $t_2$ to 1.3 volts during time $t_3$. Furthermore, the voltage at node 170 (i.e., the source of transistor M10) transitions from 1.6 volt during time $t_2$ to 1.0 volt during time $t_3$. Therefore, the maximum gate-to-source voltage difference of transistor M10 occurs during time $t_2$ and is equal to 1.3 volts (i.e., 1.6 volts−0.3 volt=1.3 volts). The voltage at node 172 (i.e., the drain of transistor M10) transitions from 1.6 volts during time $t_2$ to 0.0 volts during time $t_3$. As a result, the maximum gate-to-drain voltage difference of transistor M10 occurs during time $t_2$ and time $t_3$, and is equal to 1.3 volts (i.e., 1.6 volts−0.3 volt=1.3 volts or 1.3 volts−0.0 volt=1.3 volts). Moreover, the maximum source-to-drain voltage difference of transistor M10 occurs during time $t_3$ and is equal to 1.0 volt (i.e., 1.0 volt−0.0 volt=1.0 volt).

Referring to FIGS. 2 and 3C, the voltage at node 146 (i.e., the gate of transistor M11) transitions from 0.3 volt during time $t_2$ to 1.3 volts during time $t_3$. Furthermore, the voltage at node 122 (i.e., the drain of transistor M11) transitions from 1.6 volts during time $t_2$ to 0.0 volt during time $t_3$. As a result, the maximum gate-to-drain voltage difference of transistor M11 occurs during time $t_2$ and time $t_3$, and is equal to 1.3 volts (i.e., 1.6 volt−0.3 volt=1.3 volt or 1.3 volt−0.0 volt=1.3 volts). The voltage at node 174 (i.e., the source of transistor M11) transitions from 0.5 volt during time $t_2$ to 0.0 volt during time $t_3$. Therefore, the maximum gate-to-source voltage difference of transistor M11 occurs during time $t_3$ and is equal to 1.3 volts (i.e., 1.3 volts−0.0 volt=1.3 volts). Moreover, the maximum source-to-drain voltage difference of transistor M11 occurs during time $t_2$ and is equal to 1.1 volts (i.e., 1.6 volts−0.5 volt=1.1 volts).

Referring to FIGS. 2 and 3D, the voltage at node 148 (i.e., the gate of transistor M12) transitions from 0.0 volt during time $t_2$ to 1.3 volts during time $t_3$. Therefore, the maximum gate-to-source voltage difference of transistor M12 occurs during time $t_3$ and is equal to 1.3 volts (i.e., 1.3 volts−0.0 volt=1.3 volts). Furthermore, the voltage at node 174 (i.e., the drain of transistor M12) transitions from 0.5 volt during time $t_2$ to 0.0 volt during time $t_3$. As a result, the maximum gate-to-drain voltage difference of transistor M12 occurs during time $t_3$ and is equal to 1.3 volts (i.e., 1.3 volts−0.0 volt=1.3 volts). Clamping device 126 (see FIG. 1) may ensure the voltage at node 174 does not rise above 1.35 volts. Moreover, the maximum source-to-drain voltage difference of transistor M12 occurs during time $t_2$ and is equal to 0.5 volt (i.e., 0.5 volt−0.0 volt=0.5 volt).

As described above, pre-drivers 102, 104, 106, and 108 are configured to drive corresponding transistors M9, M10, M11, and M12 with limited voltage swings, as a result, all gate-to-source, gate-to-drain, and source-to-drain voltage drops across transistors M9, M10, M11, and M12 are also limited. Therefore, transistors M9, M10, M11, and M12 may be implemented as thin-gate dielectric transistors without the conventional reliability concerns.

Figure 6:
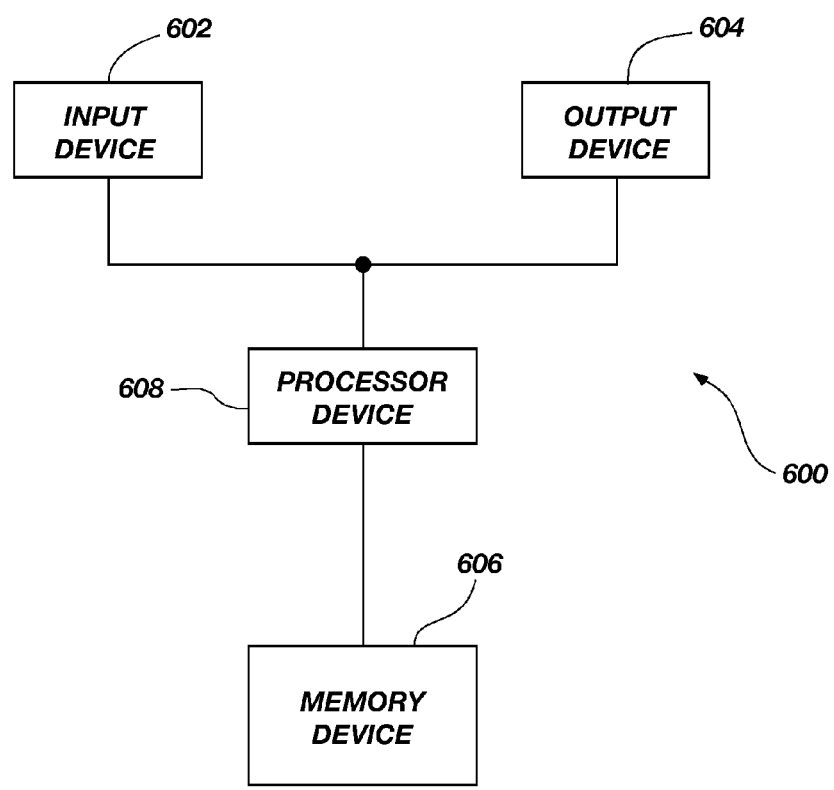
FIG. 6 is a block diagram illustrating an electronic system including a memory device with at least one buffer, in accordance with an embodiment of the present invention.

FIGS. 4 and 5 are representative timing diagrams illustrating the node voltages of buffer 100 during a startup phase 402 (FIG. 4) and a tri-state condition 502 (FIG. 5), respectively. As shown in FIG. 6, an electronic system 600 includes an input device 602, an output device 604 and a memory device 606 all coupled to a processor 608. Memory device 606 may include one or more buffers 100 (see FIG. 1), according to an embodiment of the invention as described herein above.

Specific embodiments have been shown by way of non-limiting example in the drawings and have been described in detail herein; however, the various embodiments may be susceptible to various modifications and alternative forms. It should be understood that the invention is not intended to be limited to the particular forms disclosed. Rather, the invention includes all modifications, equivalents, and alternatives falling within the scope of the invention as defined by the following appended claims and their legal equivalents.

What is claimed is:

1. A buffer, comprising:
a plurality of pre-drivers, each pre-driver of the plurality of pre-drivers operably coupled to a transistor of a plurality of transistors, wherein at least one of the pre-drivers comprises:
an inverter operably coupled between an input signal and a first transistor; and
a buffer operably coupled between the input signal and a second transistor; and
one or more clamping devices, wherein at least one transistor of the plurality of transistors has a gate operably coupled to at least one clamping device of the one or more clamping devices.

2. A buffer, comprising:
a primary pull-up pre-driver operably coupled to a primary pull-up transistor;
a secondary pull-up pre-driver operably coupled to a secondary pull-up transistor;
a primary pull-down pre-driver operably coupled to a primary pull-down transistor; and
a secondary pull-down pre-driver operably coupled to a secondary pull-down transistor;
wherein at least one of the primary pull-up pre-driver and the primary pull-down pre-driver comprises:
an inverter operably coupled between an input signal and a first transistor and configured to provide a signal to a gate of the first transistor; and
a buffer operably coupled between the input signal and a second transistor and configured to provide a signal to a gate of the second transistor.

3. The buffer of claim 2, wherein the primary -pull-up pre-driver, the secondary pull-up pre-driver, the primary pull-down pre-driver, and the secondary pull-down pre-driver are each configured to provide a sufficiently low voltage to a gate of a transistor operably coupled thereto so as to sustain a gate dielectric integrity of the transistor.

4. The buffer of claim 2, wherein at least one of the primary pull-up pre-driver and the primary pull-down pre-driver further comprises an output operably coupled between the drain of the second transistor and the source of the first transistor.

5. The buffer of claim 2, wherein a drain of the first transistor is operably coupled to a supply voltage.

6. The buffer of claim 2, wherein a source of the second transistor is operably coupled to a ground voltage.

7. The buffer of claim 2, wherein at least one of the secondary pull-up pre-driver and the secondary pull-down pre-driver comprises an inverter having an input operably coupled to an input signal and an output operably coupled to a gate of a first transistor and a gate of a second transistor.

8. The buffer of claim 7, wherein a drain of the first transistor is operably coupled to a supply voltage, a drain of the second transistor is operably coupled to a ground voltage, and a source of the first transistor is operably coupled to a source of the second transistor.

9. The buffer of claim 7, wherein at least one of the secondary pull-up pre-driver or the secondary pull-down pre-driver further comprises an output operably coupled between the source of the second transistor and the source of the first transistor.

10. A system, comprising:
a buffer, comprising:
a primary pull-up pre-driver operably coupled to a primary pull-up transistor;
a secondary pull-up pre-driver operably coupled to a secondary pull-up transistor;

a primary pull-down pre-driver operably coupled to a primary pull-down transistor;

a secondary pull-down pre-driver operably coupled to a secondary pull-down transistor; and a bulk protection circuit operably coupled to a bulk node of at least one of the secondary pull-down transistor and the secondary pull-up transistor and configured to hold the bulk node to the lower of a source voltage and a drain voltage of a transistor operably coupled thereto.

11. The system of claim 10, wherein the primary pull-up pre-driver, the secondary pull-up pre-driver, the primary pull-down pre-driver, and the secondary pull-down pre-driver are each adapted for providing a voltage to a gate of a transistor operably coupled thereto so as to sustain a gate dielectric integrity of the transistor.

12. A method of operating a buffer, the method comprising:

providing a sufficiently low first voltage from a primary pull-up pre-driver to a gate of a primary pull-up transistor so as to sustain a gate dielectric integrity of the primary pull-up transistor;

providing a sufficiently low second voltage from a secondary pull-up pre-driver to a gate of a secondary pull-up transistor so as to sustain a gate dielectric integrity of the secondary pull-up transistor;

providing a sufficiently low third voltage from a primary pull-down pre-driver to a gate of a primary pull-down transistor so as to sustain a gate dielectric integrity of the primary pull-down transistor; and providing a sufficiently low fourth voltage from a secondary pull-down pre-driver to a gate of a secondary pull-down transistor so as to sustain a gate dielectric integrity of the secondary pull-down transistor;

wherein at least one of providing a sufficiently low first voltage, providing a sufficiently low second voltage, providing a sufficiently low third voltage, and providing a sufficiently low fourth voltage comprises providing a voltage from the respective pre-driver to the respective gate having a gate-to-source, a gate-to-drain, and a source-to-drain voltage drop of less than 1.35 volts.

13. The method of claim 12, further comprising holding a bulk node of the secondary pull-down transistor to the lower of a source voltage and a drain voltage of the secondary pull-down transistor.

14. The method of claim 12, further comprising holding a bulk node of the secondary pull-up transistor to the lower of a source voltage and a drain voltage of the secondary pull-up transistor.

15. The method of claim 12, further comprising clamping a voltage of at least one of a gate of the primary pull-up transistor, a gate of the secondary pull-up transistor, a gate of the primary pull-down transistor, and a gate of the secondary pull-down transistor.

16. A method of operating a buffer, comprising:

providing a sufficiently low first voltage from a primary pull-up pre-driver to a gate of a primary pull-up transistor so as to sustain a gate dielectric integrity of the primary pull-up transistor;

providing a sufficiently low second voltage from a secondary pull-up pre-driver to a gate of a secondary pull-up transistor so as to sustain a gate dielectric integrity of the secondary pull-up transistor;

providing a sufficiently low third voltage from a primary pull-down pre-driver to a gate of a primary pull-down transistor so as to sustain a gate dielectric integrity of the primary pull-down transistor; and providing a sufficiently low fourth voltage from a secondary pull-down pre-driver to a gate of a secondary pull-down transistor so as to sustain a gate dielectric integrity of the secondary pull-down transistor;

wherein at least one of providing a sufficiently low first voltage, providing a sufficiently low second voltage, providing a sufficiently low third voltage, or providing a sufficiently low fourth voltage comprises providing a voltage that is greater than or equal to a ground voltage and less than a supply voltage.

17. The method of claim 16, further comprising limiting each of a gate-to-source, a gate-to-drain, and a source-to-drain voltage drop across the primary pull-up transistor to 1.35 volts.

18. The method of claim 16, further comprising limiting each of a gate-to-source, a gate-to-drain, and a source-to-drain voltage drop across the secondary pull-up transistor to 1.35 volts.

19. The method of claim 16, further comprising limiting each of a gate-to-source, a gate-to-drain, and a source-to-drain voltage drop across the primary pull-down transistor to 1.35 volts.

20. The method of claim 16, further comprising limiting each of a gate-to-source, a gate-to-drain, and a source-to-drain voltage drop across the secondary pull-down transistor to 1.35 volts.

* * * * *

UNITED STATES PATENT AND TRADEMARK OFFICE
CERTIFICATE OF CORRECTION

| | | |
|---|---|---|
| PATENT NO. | : 8,004,313 B2 | Page 1 of 1 |
| APPLICATION NO. | : 12/577506 | |
| DATED | : August 23, 2011 | |
| INVENTOR(S) | : V. Bringivijayaraghavan et al. | |

It is certified that error appears in the above-identified patent and that said Letters Patent is hereby corrected as shown below:

On the Title page, in field (73), in "Assignee", in column 1, line 1, delete "Bosie, ID" and insert -- Boise, ID --, therefor.

In column 8, line 33, in Claim 3, delete "-pull-up" and insert -- pull-up --, therefor.

Signed and Sealed this
Eleventh Day of October, 2011

David J. Kappos
*Director of the United States Patent and Trademark Office*